United States Patent
Kim et al.

(10) Patent No.: US 6,597,298 B2
(45) Date of Patent: Jul. 22, 2003

(54) CLOCK SYNCHRONIZATION DEVICE

(75) Inventors: Se Jun Kim, Kyoungki-do (KR); Sang Hoon Hong, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/180,131

(22) Filed: Jun. 27, 2002

(65) Prior Publication Data

US 2003/0006923 A1 Jan. 9, 2003

(30) Foreign Application Priority Data

Jun. 29, 2001 (KR) .......................... 2001-38031

(51) Int. Cl.$^7$ ................................ H03M 1/48

(52) U.S. Cl. ....................... 341/111; 375/356

(58) Field of Search ................ 341/111; 375/356

(56) References Cited

U.S. PATENT DOCUMENTS 5,790,608 A * 8/1998 Benayoun et al. .......... 375/356

* cited by examiner

Primary Examiner—Peguy JeanPierre
Assistant Examiner—Joseph Lauture
(74) Attorney, Agent, or Firm—Pillsbury Winthrop LLP

(57) ABSTRACT

A clock synchronization device divides a digital-to-analog converting unit into main and sub digital-to-analog converters and operates both main and sub digital-to-analog converting units if an output voltage of the digital-to-analog converting unit is lower than a reference voltage based on a voltage obtained when the delay rate of a variable delay line VDL is sharply increased or operates only the main digital-to-analog converting unit if the output voltage of the digital-to-analog converting unit is higher than the reference voltage. As a result, the clock synchronization device can make the output voltage of the digital-to-analog converting unit be linear with respect to a digital code, thereby improving a jitter property in a band with a very large gain of the variable delay line.

12 Claims, 6 Drawing Sheets

CLOCK SYNCHRONIZATION DEVICE

BACKGROUND

1. Field of the Invention

The inventions described and or claimed relate generally to clock synchronization. More particularly, they relate to a clock synchronization arrangement (apparatus and methods) capable of improving (lowering) jitter in a variable delay line VDL operating in a low frequency band with a very large gain. Operations of main and sub digital-to-analog converters are determined by a result of comparing a reference voltage with an output voltage of the digital-to-analog converter.

2. Description of Related Art

Generally, a clock synchronization device of the analog type (delayed locked loop DLL or phase locked loop PLL) occupies a smaller area, and has a larger operating region, a higher precision and a smaller jitter than a digital type, but it consumes a large DC current.

Therefore, a hybrid type clock synchronization device including both analog and digital components is being used. An example of such a clock synchronization device is one that uses a digital-to-analog converter DAC. A digital code corresponding to a phase difference between an external clock signal and an internal clock signal is generated. An analog value (voltage or current) is generated from the digital code, which, in turn, controls the clock synchronization device.

FIG. 1 (Prior Art) is a block diagram of a clock synchronization device using a known digital-to-analog converter. The clock synchronization device is constructed as a delayed locked loop DLL. The clock synchronization device includes a phase detecting unit 1, a binary code generating unit 2, a digital-to-analog converting unit 3 and a variable delay line VDL. The phase detecting unit 1 detects a phase difference between an external clock signal ECLK and an internal clock signal ICLK. The binary code generating unit 2 outputs a binary code BC of N bits according to a detection signal SFTR, SFTL from phase detecting unit 1. The digital-to-analog converting unit 3 generates a voltage VDAC corresponding to the binary code BC of the binary code generating unit 2. The variable delay line VDL 4 delays the external clock signal ECLK for a predetermined time and outputs an internal clock signal ICLK by using the output voltage VDAC from the digital-to-analog converting unit 3.

FIG. 2 is a circuit diagram illustrating a detail circuit of a delay cell of a variable delay line shown in the block diagram of FIG. 1 (Prior Art). The variable delay line 4 includes chains of a plurality of delay cells.

Each delay cell includes a variable current source 5 for generating current according to the output voltage VDAC from the digital-to-analog converting unit 3, an input unit 6 for receiving input signals IN and /IN (the input signals IN and /IN of the first delay cell are output voltages VDAC and NVDAC, and the input signals IN and /IN of the second through last delay cells are the output signals OUT and /OUT of the preceding delay cell), and a load 7 for determining a delay rate.

The variable current source 5 is formed of an NMOS transistor NM0 in which an output voltage VDAC is applied to a control terminal and a source is connected to a ground voltage VSS.

The input unit 6 is formed of NMOS transistors NM1 and NM2 for receiving input signals IN and /IN to the control terminal. Here, the common source of the NMOS transistors NM1 and NM2 are connected to the drain of the NMOS transistor NM0. The drains of the NMOS transistors NM1 and NM2 form an output terminal to produce output signals OUT and /OUT, respectively.

In the variable delay line 4 comprising chains of delay cells, the output signals OUT and /OUT of an (i−1)th delay cell are inputted respectively into input signals IN and /IN of an i-th delay cell, and the output signals OUT and /OUT of the i-th delay cell are inputted respectively into input signals IN and /IN of an (i+1)th delay cell.

The delay rate TDCEL of a delay cell with respect to current I flowing in the NMOS transistor NM0 forming the variable current source 5 of the delay cell is obtained by the following equation 1.

$$TDCEL = \frac{C \times VPP}{I} \qquad \text{equation 1}$$

Here, C represents the capacitance between the output terminals of a delay cell, and VPP represents the voltage swing width between the output terminals.

Therefore, the relation between the output voltage VDAC of the digital-to-analog converting unit 3 and the delay rate T of the variable delay line 4 has a non-linear property as shown in the graph of FIG. 3.

If it is assumed that the unit step voltage VDEL of the digital-to-analog converting unit 3 has a linear delay property with respect to the output voltage VDAC of the digital-to-analog converting unit 3, the unit phase resolution PRES of the clock synchronization device (here, "DLL") can be obtained by the following equation 2.

$$PRES = KVDL \times VDEL \qquad \text{equation 2}$$

Here, KVDL represents a gain of the delay cell of the variable delay line 4, which can be obtained by the following equation 3.

$$KVDL = \frac{dt}{dv} \qquad \text{equation 3}$$

Here, dt represents the rate of change in unit time, and dv represents the rate of change in unit voltage. The gain KVDL of the delay cell DCEL of the variable delay line 4 is constant. Accordingly, the phase resolution is constant regardless of an input clock frequency.

Contrary to the above assumption, since the delay property of the variable delay line 4 is non-linear, the phase resolution changes as a function of clock frequency. FIG. 3 is a graph illustrating a delay time of a variable delay line with respect to an output voltage of a digital-to-analog converting unit according to the block diagram of FIG. 1. As illustrated in FIG. 3, when the output voltage VDAC of the digital-to-analog converting unit 3 reaches a predetermined voltage VREF because of a decrease in frequency, the phase resolution is sharply increased, thereby degrading the jitter of the clock synchronization device (here, "DLL").

SUMMARY

The various inventions described and/or claimed herein provide a clock synchronization arrangement capable of improving jitter even for a low frequency clock signal by adjusting the number of input bits of a digital-to-analog converting unit according to a level of the output voltage.

There is provided a clock synchronization arrangement including a phase detector, a code generator, a digital-to-analog (D/A) converter, a level detector and a clock synchronization controller. The phase detector detects a phase difference between an external clock signal and an internal clock signal. The code generator generates codes of N bits according to the phase difference. The D/A converter generates a voltage corresponding to the codes of N bits from the code generator. The level detector compares the voltage from the D/A converter with a predetermined reference voltage, and outputs a control signal to adjust a level of the voltage from the D/A converter according to the comparing result. The clock synchronization controller outputs an internal clock signal after delaying the external clock signal for a predetermined time, wherein the predetermined time is determined by the voltage from the D/A converter.

DETAILED DESCRIPTION

Preferred embodiments of the present invention will be described with reference to the accompanying drawings.

Figure 1:
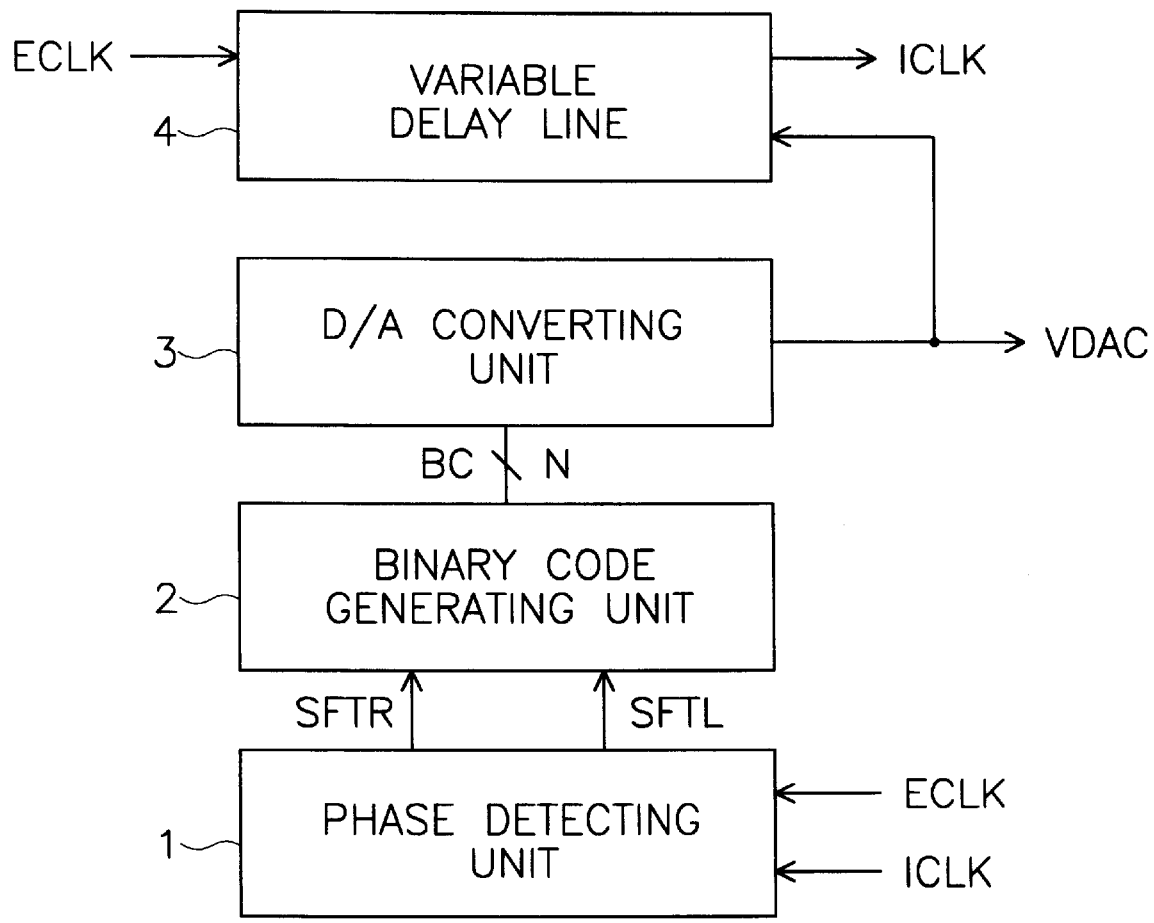
FIG. 1 (Prior Art) is a block diagram illustrating a clock synchronization device using a digital-to-analog converting unit according to the conventional art.
Figure 2:
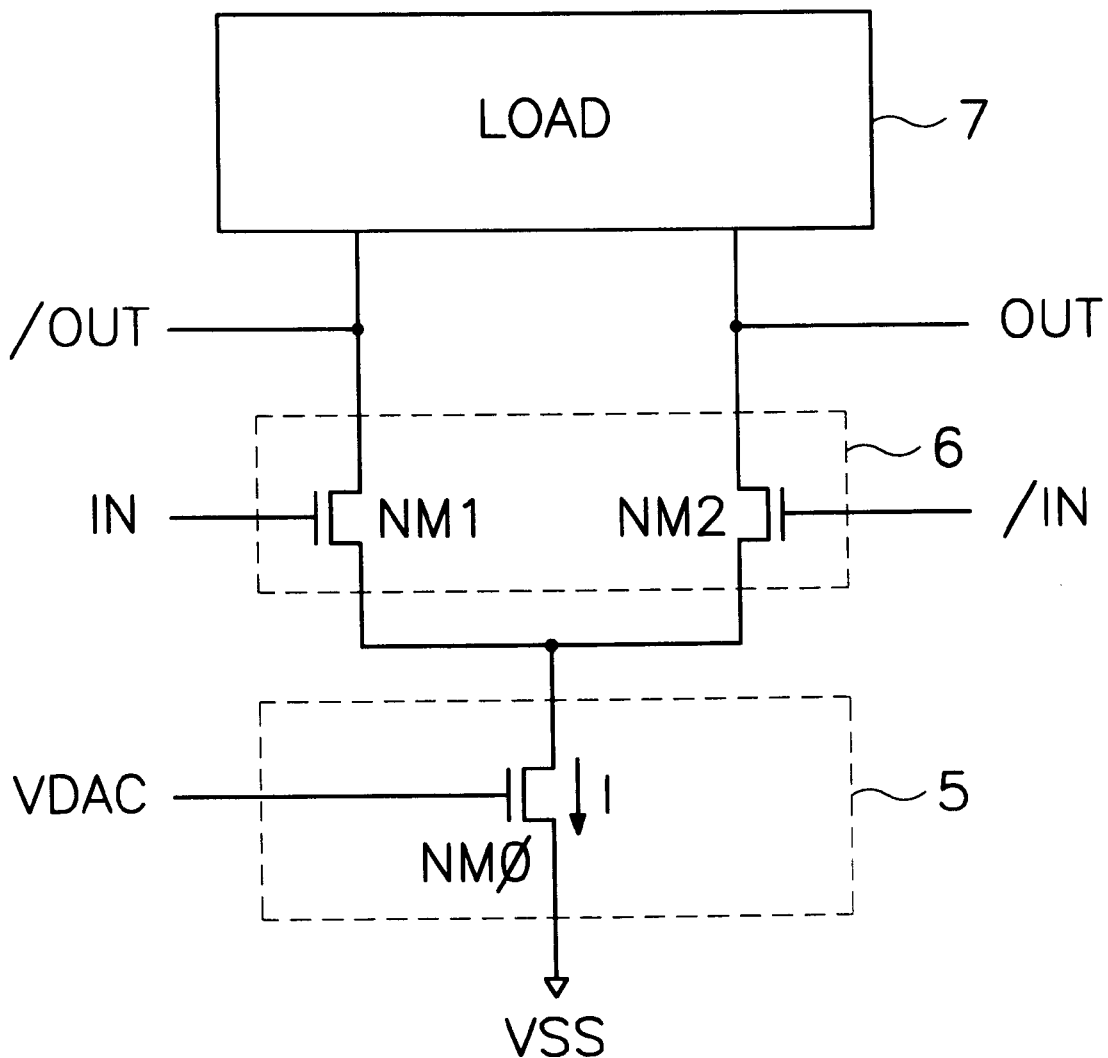
FIG. 2 (Prior Art) is a circuit diagram illustrating a detail circuit of a delay cell of a variable delay line shown in the block diagram of FIG. 1.
Figure 3:
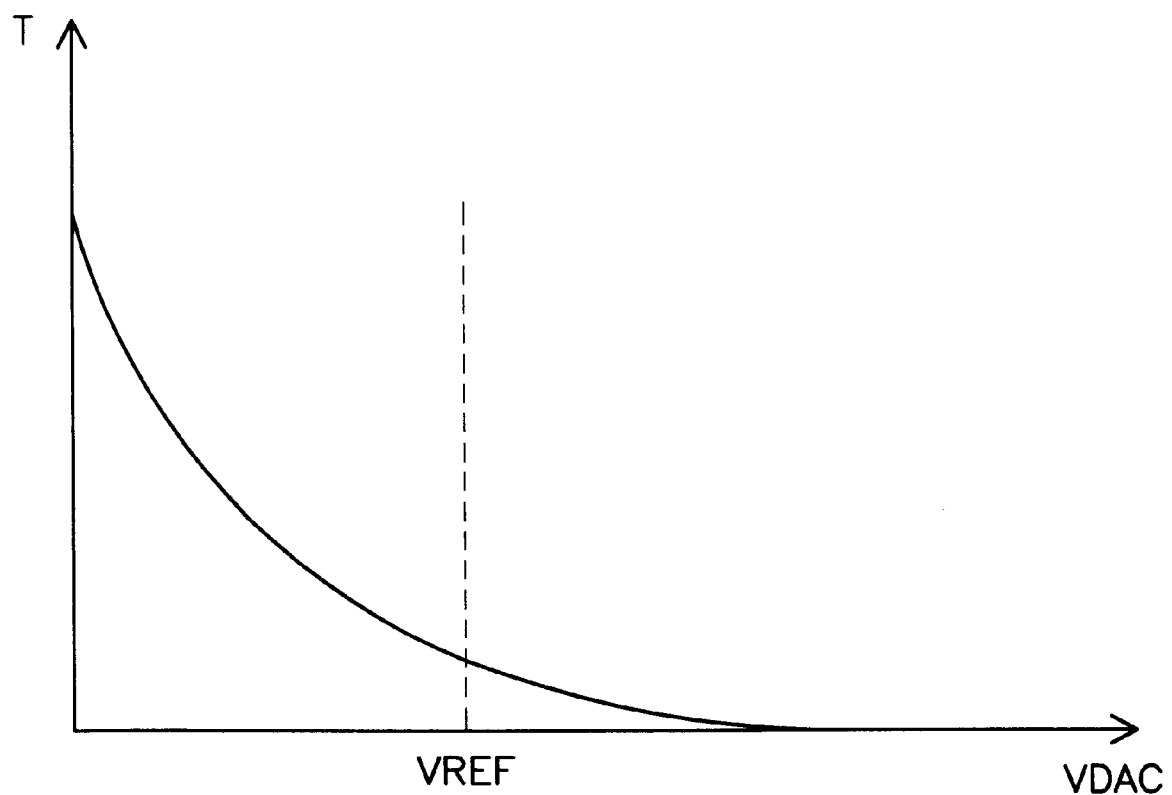
FIG. 3 (Prior Art) is a graph illustrating a delay time of a variable delay line with respect to an output voltage of a digital-to-analog converting unit according to the block diagram of FIG. 1.
Figure 4:
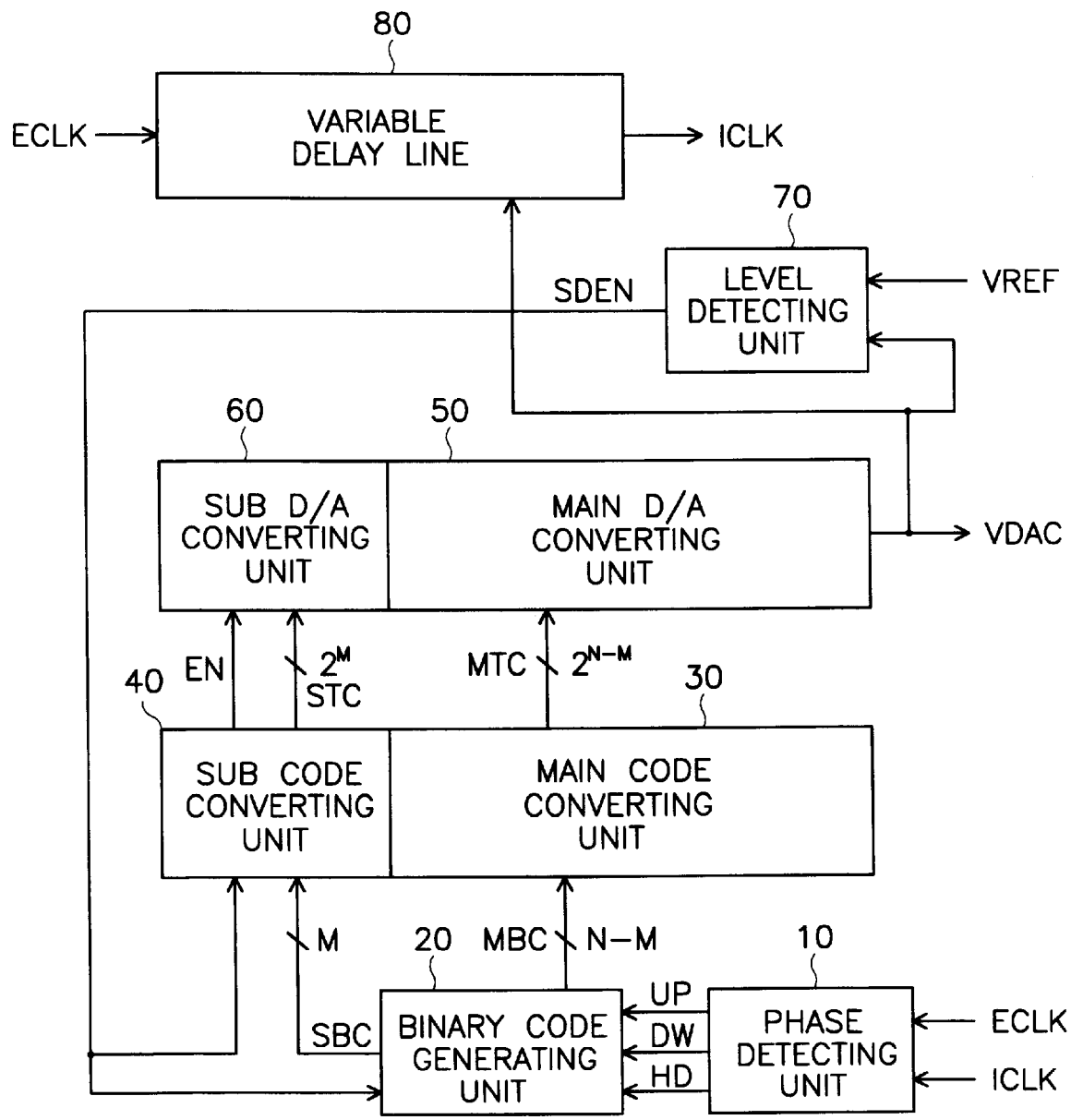
FIG. 4 is a block diagram illustrating a clock synchronization device according to an embodiment of the present invention.

FIG. 4 is a block diagram illustrating a clock synchronization device according to a first embodiment of the present invention, wherein a delayed locked loop DLL will be explained as an example.

As illustrated in FIG. 4, the clock synchronization device includes a phase detecting unit 10, a binary code generating unit 20, a main code converting unit 30, a sub code converting unit 40, a main digital-to-analog converting unit 50, a sub digital-to-analog converting unit 60, a level detecting unit 70 and a variable delay line 80.

Here, the main and sub digital-to-analog converting units 50 and 60 are constituted by a thermometer code digital-to-analog converter (thermometer code DAC).

The phase detecting unit 10 detects a phase difference between an external clock signal ECLK and an internal clock signal ICLK to output detection signals UP, DW and HD.

The binary code generating unit 20 including an up/down converter (not shown) and a plurality of registers (not shown), outputs a binary code BC according to the detection signals UP, DW and HD of the phase detecting unit 10. That is, it outputs binary codes MBC and SBC of N bits or a binary code MBC of N–M bits according to an enable signal SDEN of the level detecting unit 70.

The main code converting unit 30 converts the binary code MBC of upper bits (N–M) of the binary code generating unit 20 into a thermometer code MTC, and the sub code converting unit 40 converts the binary code SBC of lower bits M of the binary code generating unit 20 into a thermometer code STC.

The level detecting unit 70 compares an output voltage VDAC from the main and sub digital-to-analog converting units 50 and 60 with a predetermined reference voltage VREF, and outputs an enable signal SDEN according to the result of the comparison. The predetermined reference voltage VREF is obtained at a point when a gain of a variable delay line is sharply increased.

Here, if the output voltage VDAC is lower than the reference voltage VREF, the sub code converting unit 40 enables the sub digital-to-analog converting unit 60 according to the enable signal SDEN. If the output voltage VDAC is higher than the reference voltage VREF, the sub code converting unit 40 generates a control signal EN for disabling the sub digital-to-analog converting unit 60.

In addition, if the voltage VDAC outputted from the main and sub digital-to-analog converting units 50 and 60 is higher than the reference voltage VREF, the binary code generating unit 20 generates binary codes MBC and SBC of N bits. If the voltage VDAC outputted from the main and sub digital-to-analog converting units 50 and 60 is lower than the reference voltage VREF, the binary code generating unit 20 outputs only a binary code MBC of upper bits (N–M).

Among the N-bit binary codes MBC and SBC of the binary code generating unit 20, the binary code MBC of upper bits (N–M) is converted into a thermometer code MTC of $2^{N-M}$ bits by the main code converting unit 30. The thermometer code MTC is applied to the main digital-to-analog converting unit 50. Among the N-bit binary codes MBC and SBC of the binary code generating unit 20, the binary code SBC of lower bits M is converted into a thermometer code STC of $2^M$ bits by the sub code converting unit 40. The thermometer code STC is applied to the sub-digital-analog converting unit 60.

Therefore, if the output voltage VDAC outputted from the main and sub digital-to-analog converting units 50 and 60 is higher than the reference voltage VREF, both main and sub digital-to-analog converting units 50 and 60 are operated to output the output voltage VDAC corresponding to the thermometer codes MTC and STC of $2^N$ bits. If the output voltage VDAC outputted from the main and sub digital-to-analog converting units 50 and 60 is lower than the reference voltage VREF, only the main digital-to-analog converting unit 50 is operated to output the output voltage VDAC corresponding to the input thermometer code MTC of $2^{N-M}$ bits. At this time, the sub digital-to-analog converting unit 60 is not operated because it is disabled by a control signal EN of the sub code converting unit 40.

Figure 5:
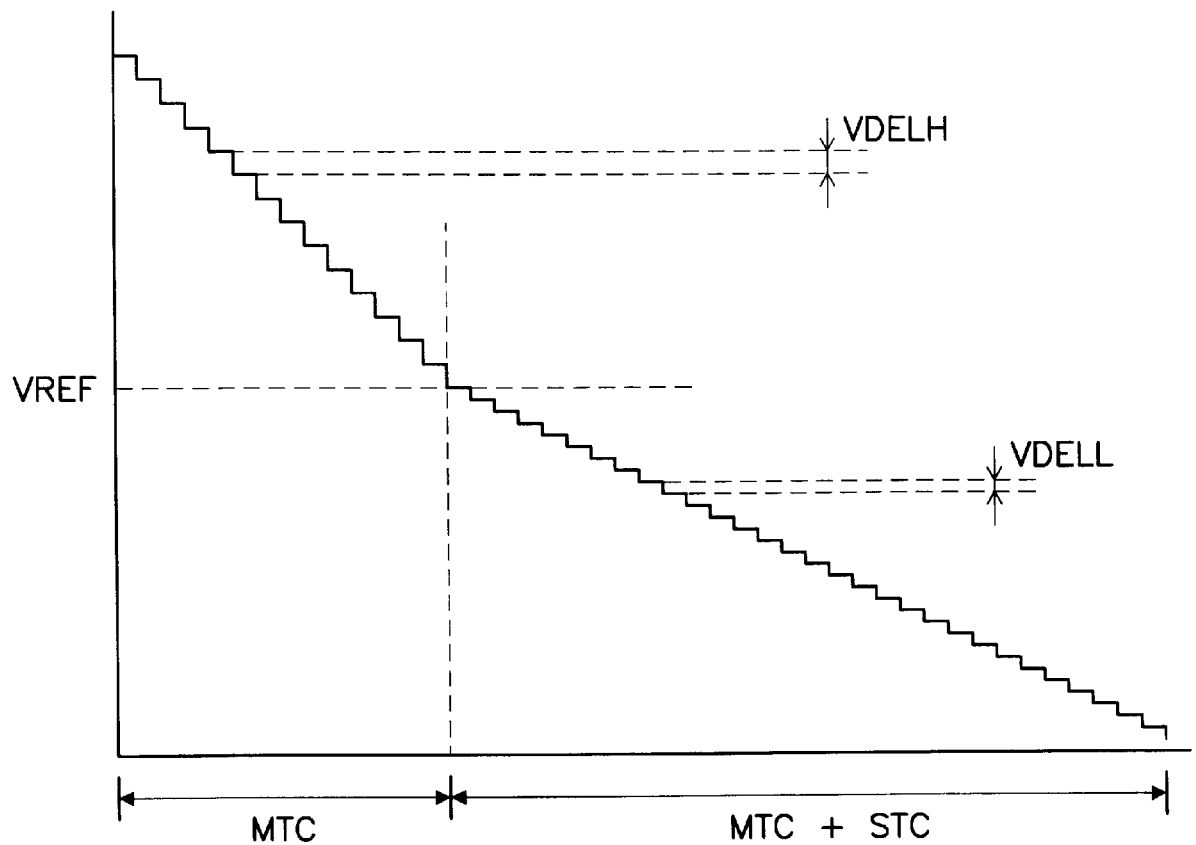
FIG. 5 is a graph illustrating an output voltage of the digital-to-analog converting unit per code according to the block diagram of FIG. 4.

FIG. 5 is a graph illustrating an output voltage of the digital-to-analog converting unit per code according to the block diagram of FIG. 4. If the output voltage VDAC is higher than the reference voltage VREF, only the main digital-to-analog converting unit 50 is operated. At this time, a unit step voltage VDELH can be obtained by the following equation 4.

$$VDELH = \frac{VDAC}{2^{N-M}} \qquad \text{equation 4}$$

Meanwhile, if the output voltage VDAC is lower than the reference voltage VREF, both main and sub digital-to-analog converting units 50 and 60 are operated, At this time, a unit step voltage VDELL can be obtained by the following equation 5.

$$VDELL = \frac{VDAC}{2^N} \qquad \text{equation 5}$$

It is possible to prevent the phase resolution of the variable delay line 80 from being sharply increased due to the non-linear delay property by making the smaller unit step voltage VDELL obtained when the output voltage VDAC is lower than the reference voltage VREF as compared to the unit step voltage VDELH obtained when the output voltage VDAC is higher than the reference voltage VREF.

Figure 6:
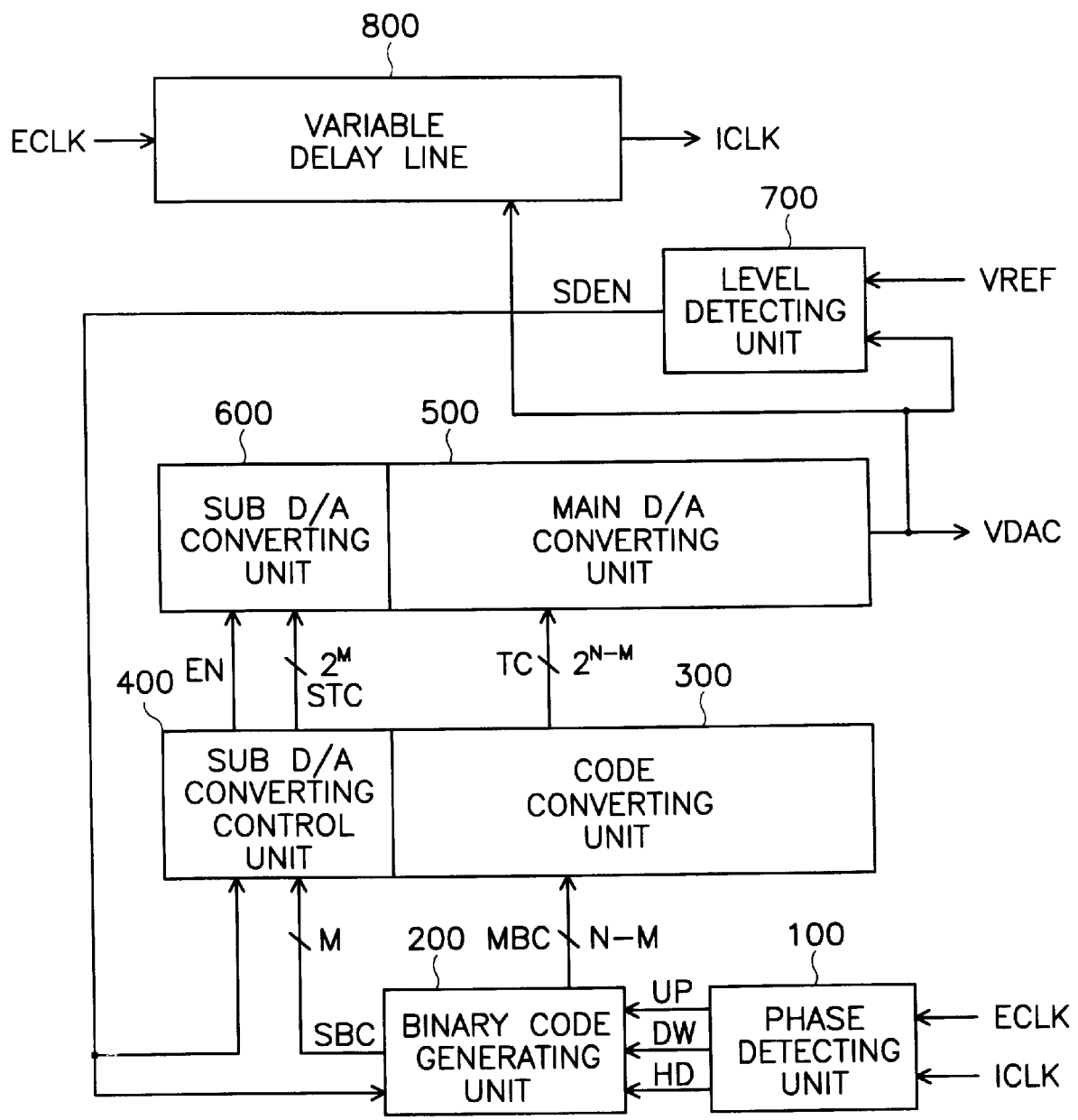
FIG. 6 is a block diagram illustrating a clock synchronization device according to another embodiment of the present invention.

FIG. 6 is a block diagram illustrating a clock synchronization device according to a second embodiment of the present invention.

The clock synchronization device according to the second embodiment of the present invention includes a phase detecting unit 100, a binary code generating unit 200, a code converting unit 300, a main digital-to-analog converting unit 500, a sub digital-to-analog converting unit 600, a level detecting unit 700 and a variable delay line 800.

The thusly-constructed clock synchronization device according to the second embodiment of the present invention is different from the first embodiment in that the main digital-to-analog converting unit 500 is constructed of a thermometer code DAC, that the sub digital-to-analog converting unit 600 is constructed of a binary-weighted code DAC, and that a sub digital-to-analog conversion control unit 400 substitutes the sub code converting unit 40.

If the output voltage VDAC of the main and sub digital-to-analog converting units 500 and 600 is higher than the reference voltage VREF, the sub digital-to-analog conversion control unit 400 disables the sub digital-to-analog converting unit 600 by a control signal EN generated according to an enable signal SDEN of the level detecting unit 700.

Thus, the binary code MBC of upper bits (N–M) of the binary code generating unit 200 is converted into a thermometer code TC by the code converting unit 300 to output a voltage corresponding to the thermometer code TC of $2^{N-M}$ bits.

If the output voltage VDAC of the main and sub digital-to-analog converting units 500 and 600 is lower than the reference voltage VREF, the sub digital-to-analog conversion control unit 400 enables the digital-to-analog converting unit 600 by the control signal EN generated according to the enable signal SDEN of the level detecting unit 700. That is, both main and sub digital-to-analog converting units 500 and 600 are operated.

Accordingly, the main and sub digital-to-analog converting units 500 and 600 output the output voltage VDAC corresponding to the N-bit binary codes MBC and SBC of the binary code generating unit 200.

The clock synchronization device according to the second embodiment of the present invention is operated in the same manner as the first embodiment, so that a detailed description thereof will be omitted.

The inventions claimed and/or described herein can prevent the phase resolution of an output voltage from being sharply increased since the clock synchronization device increases a number of bits of the digital-to-analog converter and thus decreases the unit step voltage of the digital-to-analog converting unit by dividing the digital-to-analog converting unit controlling clock synchronization devices DLL, PLL, etc. Into main and sub digital-to-analog converting units, detecting an output voltage of the digital-to-analog converter of which the phase resolution is sharply increased and which is higher than a particular voltage, and operating the sub digital-to-analog converting unit. Thus, the present invention provides an effect of preventing a sharp increase in jitter in a low frequency band.

What is claimed is:

1. A clock synchronization device comprising:
   a phase detecting means for detecting a phase difference between an external clock signal and an internal clock signal;
   a code generating means for generating codes of N bits according to the phase difference;
   a digital-to-analog (D/A) convening means for generating a voltage corresponding to the codes of N bits from the code generating means;
   a level detecting means for comparing the voltage from the D/A converting means with a predetermined reference voltage, and outputting a control signal to adjust a level of the voltage from the D/A converting means according to the comparing result; and
   a clock synchronization control means for outputting the internal clock signal after delaying the external clock signal for a predetermined time, wherein the predetermined time is determined by the voltage from the D/A convening means.

2. The clock synchronization device according to claim 1, wherein the D/A converting means comprises:
   a main D/A converting means for outputting a voltage corresponding to upper bits N–M among the codes of N bit of the code generating means; and
   a sub D/A converting means enabled according to the control signal of the level detecting a means for outputting a voltage corresponding to lower M bits among the codes of N bit of the code generating means.

3. The clock synchronization device of claim 2, wherein the main and sub D/A converting means are constructed of a thermometer code digital-to-analog converting means.

4. The clock synchronization device of claim 3, wherein the code generating means comprises:
   a binary code generating means for generating a binary code according to the output signal of the phase detecting means;
   a main code converting means for converting the binary code of upper bits N–M among binary codes outputted from the binary code generating unit into a thermometer code and outputting it to the main code converting means; and
   a sub code converting means for converting the binary code of lower bits M among binary codes outputted from the binary code generating unit into a thermometer code and outputting it to the sub code converting means.

5. The clock synchronization device of claim 2, wherein the a main D/A converting means is constructed of a thermometer code D/A converting means, and the sub D/A converting means is constructed of a binary-weighted code D/A converting means.

6. The clock synchronization device of claim 5, wherein the code generating means comprises:
- a binary code generating means for generating a binary code according to the output signal of the phase detecting means;
- a main code converting means for converting the binary code of upper bits N–M among binary codes outputted from the binary code generating unit into a thermometer code and outputting it to the main code converting means; and
- a sub code converting means for enabling selectively the sub digital-to-analog converting means according to the output signal of the level detecting means and outputting the binary code of lower bits M among binary codes outputted from the binary code generating unit.

7. A clock synchronization device comprising:
- a phase detector capable of detecting a phase difference between an external clock signal and an internal clock signal;
- a code generator for generating codes of N bits according to the phase difference;
- a digital-to-analog (D/A) converter for generating a voltage corresponding to the codes of N bits from the code generator,
- a level detector for comparing the voltage from the D/A converter with a predetermined reference voltage, and outputting a control signal to adjust a level of the voltage from the D/A converter according to the comparing result; and
- a clock synchronization controller for outputting an internal clock signal after delaying the external clock signal for a predetermined time, wherein the predetermined time is determined by the voltage from the D/A converter.

8. The clock synchronization device according to claim 7, wherein the D/A converter comprises:
- a main D/A converter for outputting a voltage corresponding to upper bits N–M among the codes of N bit of the code generator; and
- a sub D/A converter enabled according to the control signal of the level detector for outputting a voltage corresponding to lower M bits among the codes of N bit of the code generator.

9. The clock synchronization device of claim 8, wherein the main and sub digital-to-analog converters are constructed of a thermometer code D/A converter.

10. The clock synchronization device of claim 9, wherein the code generator comprises:
- a binary code generator for generating a binary code according to the output signal of the phase detector;
- a main code converter for converting the binary code of upper bits N–M among binary codes outputted from the binary code generating unit into a thermometer code and outputting it to the main code converter; and
- a sub code converter for converting the binary code of lower bits M among binary codes outputted from the binary code generator into a thermometer code and outputting it to the sub code converter.

11. The clock synchronization device of claim 8, wherein the main digital-to-analog converter is constructed of a thermometer code D/A converter, and
the sub digital-to-analog converter is constructed of a binary-weighted code D/A converter.

12. The clock synchronization device of claim 11, wherein the code generator comprises:
- a binary code generator for generating a binary code according to the output signal of the phase detector;
- a main code converter for converting the binary code of upper bits N–M among binary codes outputted from the binary code generating unit into a thermometer code and outputting it to the main code converter; and
- a sub code converter for enabling selectively the sub digital-to-analog converter according to the output signal of the level detector and outputting the binary code of lower bits M among binary codes outputted from the binary code generating unit.

* * * * *